United States Patent
Kroener et al.

(10) Patent No.: US 12,123,921 B2
(45) Date of Patent: Oct. 22, 2024

(54) METHOD AND APPARATUS FOR DETERMINING A STATE OF HEALTH OF AN ELECTRICAL ENERGY STORE OF UNKNOWN TYPE BY USING MACHINE LEARNING METHODS

(71) Applicant: Robert Bosch GmbH, Stuttgart (DE)

(72) Inventors: Christoph Kroener, Rosstal (DE); Christian Simonis, Leonberg (DE); Christoph Woll, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 484 days.

(21) Appl. No.: 17/486,507

(22) Filed: Sep. 27, 2021

(65) Prior Publication Data

US 2022/0097550 A1 Mar. 31, 2022

(30) Foreign Application Priority Data

Sep. 29, 2020 (DE) .................... 10 2020 212 234.2

(51) Int. Cl.
| | |
|---|---|
| *H02J 7/00* | (2006.01) |
| *B60L 53/65* | (2019.01) |
| *B60L 58/16* | (2019.01) |
| *G01R 31/367* | (2019.01) |
| *G01R 31/392* | (2019.01) |
| *G06N 20/00* | (2019.01) |
| *G06N 3/044* | (2023.01) |

(52) U.S. Cl.
CPC ............ *G01R 31/392* (2019.01); *B60L 53/65* (2019.02); *B60L 58/16* (2019.02); *G01R 31/367* (2019.01); *G06N 20/00* (2019.01); *G06N 3/044* (2023.01)

(58) Field of Classification Search
CPC .... G01R 31/392; G01R 31/367; G06N 20/00; G06N 3/044; B60L 53/65; B60L 58/16
USPC ...................... 320/109; 701/22; 324/425–434
See application file for complete search history.

(56) References Cited

U.S. PATENT DOCUMENTS

| | | | | |
|---|---|---|---|---|
| 10,162,401 | B1 * | 12/2018 | Brys | ................. G01R 31/3842 |
| 10,180,460 | B1 * | 1/2019 | Castelaz | ................. B60L 58/16 |
| 2019/0315237 | A1 | 10/2019 | Trnka et al. | |
| 2020/0384886 | A1 * | 12/2020 | Namiki | ................... B60L 58/13 |

FOREIGN PATENT DOCUMENTS

WO 2019/057871 A1 3/2019

* cited by examiner

*Primary Examiner* — Zixuan Zhou
(74) *Attorney, Agent, or Firm* — Maginot, Moore & Beck LLP

(57) ABSTRACT

A computer-implemented method for ascertaining a state of health trajectory of an electrical energy store of a device, in particular an electrically driveable motor vehicle. The method including continually providing characteristics of operating variables that characterize operation of the electric energy store, ascertaining states of health based on the operating variables using an empirical state of health model at multiple times, parameterizing a trajectory function for describing the state of health trajectory based on multiple state of health points that each indicate one of the states of health of the ascertained states of health based on a time-dependent reference variable, and providing the trajectory function.

11 Claims, 3 Drawing Sheets

METHOD AND APPARATUS FOR DETERMINING A STATE OF HEALTH OF AN ELECTRICAL ENERGY STORE OF UNKNOWN TYPE BY USING MACHINE LEARNING METHODS

This application claims priority under 35 U.S.C. § 119 to patent application no. DE 10 2020 212 234.2, filed on Sep. 29, 2020 in Germany, the disclosure of which is incorporated herein by reference in its entirety.

FIELD

The disclosure relates to electrical devices operated independently of the mains and having electrical energy stores, in particular electrically driveable motor vehicles, in particular electric vehicles or hybrid vehicles, and additionally to measures for determining a state of health (SOH) of the electrical energy stores. Additionally, the disclosure relates to not only mobile but also stationary electrical energy stores.

BACKGROUND

The supply of power to electrical devices and machines operated independently of the mains, such as e.g. electrically driveable motor vehicles, is provided using electrical energy stores, normally device batteries or vehicle batteries. These deliver electrical energy for operating the devices. Fuel cells are also possible electrical energy stores, however.

The state of health of an energy store declines appreciably over the course of its life, the effect of which is a declining maximum storage capacity. The extent of the aging of the energy store is dependent on an individual load on the energy store, i.e. in the case of vehicle batteries of motor vehicles on the usage behavior of a driver, external ambient conditions and on the vehicle battery type.

Although an empirical state of health model can be used to determine the present state of health of the energy store based on historical operating state characteristics, this model is inaccurate in certain situations. Moreover, the aging of the energy store is dependent on an individual load on the energy store, i.e. on the usage behavior of a user and on the battery type. The resultant inaccuracy of the conventional state of health model hampers prediction of the state of health characteristic. However, the prediction of the characteristic of the state of health of the energy stores is an important technical variable, since it allows ascertainment of a remaining life and a financial assessment of a residual value of the energy store.

SUMMARY

The disclosure provides for a method for ascertaining a state of health trajectory of an electrical energy store for operating a device, in particular an electrically driveable motor vehicle, on the basis of a state of health of a vehicle battery, and an apparatus.

According to a first aspect, there is provision for a computer-implemented method for ascertaining a state of health trajectory of an electrical energy store of a device, in particular an electrically driveable motor vehicle, comprising the following steps:

continually providing characteristics of operating variables that characterize the operation of the specific energy store;

ascertaining states of health on the basis of the operating variables by using an empirical state of health model at multiple times;

parameterizing a trajectory function for describing the state of health trajectory on the basis of multiple state of health points that each indicate an ascertained state of health on the basis of a time-dependent reference variable, providing the trajectory function.

To date, the state of health has been determined using state of health models adapted for a specific, previously known battery type. Sufficient battery parameters and battery measurement signals are available for such vehicle batteries of known battery type, which means that the state of health can be determined with sufficient accuracy using a state of health model associated with the battery type.

State of health (SOH) is the key variable for indicating a remaining battery capacity or remaining battery charge. The state of health can be indicated as a capacity retention rate (SOH-C) or as a rise in the internal resistance (SOH-R). The capacity retention rate SOH-C is indicated as a ratio of the measured present capacity to an initial capacity of the fully charged battery. The relative change in the internal resistance SOH-R rises as the battery ages.

A wide variety of battery types will be able to be used in future electrically operable motor vehicles, however. As such, it is foreseeable that electric vehicles will also be operated with removable batteries, with a wide variety of battery types from different manufacturers being able to be used. These are a great challenge for applicable models describing the battery type, in particular for a state of health model, since fundamental battery parameters are not known. The battery parameters are substantially dependent on the cell chemistry and on the structure and interconnection of the battery cells and can therefore differ substantially from battery type to battery type.

Even with conventional models, ascertaining the state of health of a vehicle battery is difficult. The implementation of a simple physical or empirical state of health model in a motor vehicle is subject to substantial inaccuracies, meaning that the maximum model error is often not less than 5%, since it is essentially dependent on the usage-individual operating characteristic. In the case of unknown types of electrical energy stores (battery types and the like), i.e. the electrochemical model is not known, the challenge for model-based determination of the state of health is even greater, since it is usually not possible to use domain-specific knowledge concerning the physical description, specifically the electrochemical variables. Moreover, data that contain a large amount of noise or are incomplete are usually used, said data being influenced by different load profiles, such as e.g. outside temperatures, distances, route sections traveled and the like in the case of a motor vehicle, user profiles, such as for example charging behavior, regularity of fast charging, driving behavior and the like, and additionally by series control of the electrical energy store.

In the case of vehicle batteries of unknown battery type, applicable battery control systems provide for only the commonest operating variables, such as present battery current, present battery voltage, present battery temperature and present state of charge, to be output, depending on the manufacturer. Whereas further battery parameters are available in the battery management system or in the central processing unit for known battery types, there is a lack of any details regarding the cell chemistry and the internal structure of the battery cells for unknown battery types, which means that detection of a battery type and modeling of the state of health are difficult.

For unknown battery types, it is therefore moreover necessary to ascertain the state of health entirely on the basis of operating variables that are provided by the applicable battery control unit. These do not generally permit a more in-depth insight into the cell chemistry and the internal structure of the vehicle battery.

There can be provision for the reference variable to be provided as an elapsed life since startup (Beginning of Life), an Ah throughput or accumulated performance information for the device, such as a total distance covered by a motor vehicle as the device.

The method above therefore provides for a characteristic of operating variables to be taken as a basis for providing an empirical state of health model that allows improved determination of a present and a predicted state of health. This is accomplished by ascertaining a state of health trajectory in the form of a trajectory function from a multiplicity of measurements, the trajectory function indicating the state of health on the basis of a time-based reference variable.

There can be provision for the empirical state of health model to determine a state of health on the basis of a change in charge in a charging process and/or a discharge process and/or from an internal resistance determination using a change in voltage for a specific battery current characteristic.

Additionally, the trajectory function can comprise a linear function, a polynomial function, a data-based model, in particular a regression model, such as a Gaussian process, a neural network or a recurrent neural network.

They can be provision for the energy store to be used for operating a device, such as a motor vehicle, a pedelec, an aircraft, in particular a drone, a machine tool, a consumer electronics device, such as a mobile phone, an autonomous robot and/or a domestic appliance.

According to a further aspect, there is provision for an apparatus for ascertaining a state of health trajectory of an electrical energy store of a device, in particular an electrically driveable motor vehicle, using the following steps:
continually providing characteristics of operating variables that characterize the operation of the specific energy store;
ascertaining states of health on the basis of the operating variables by using an empirical state of health model at multiple times;
parameterizing a trajectory function for describing the state of health trajectory on the basis of multiple state of health points that each indicate an ascertained state of health on the basis of a time-dependent reference variable,
providing the trajectory function.

BRIEF DESCRIPTION OF THE DRAWINGS

Embodiments are explained in more detail below with reference to the accompanying drawings, in which.

DETAILED DESCRIPTION

The method according to the disclosure is described below on the basis of vehicle batteries as an electrical energy store in a motor vehicle as a battery-operated device. This example is representative of a multiplicity of stationary or mobile devices with mains-independent supply of power, such as for example vehicles (electric vehicles, pedelecs, etc.), installations, machine tools, domestic appliances, IoT devices and the like, that are connected to a central processing unit (cloud) by way of an appropriate communication connection (e.g LAN, Internet).

Figure 1:
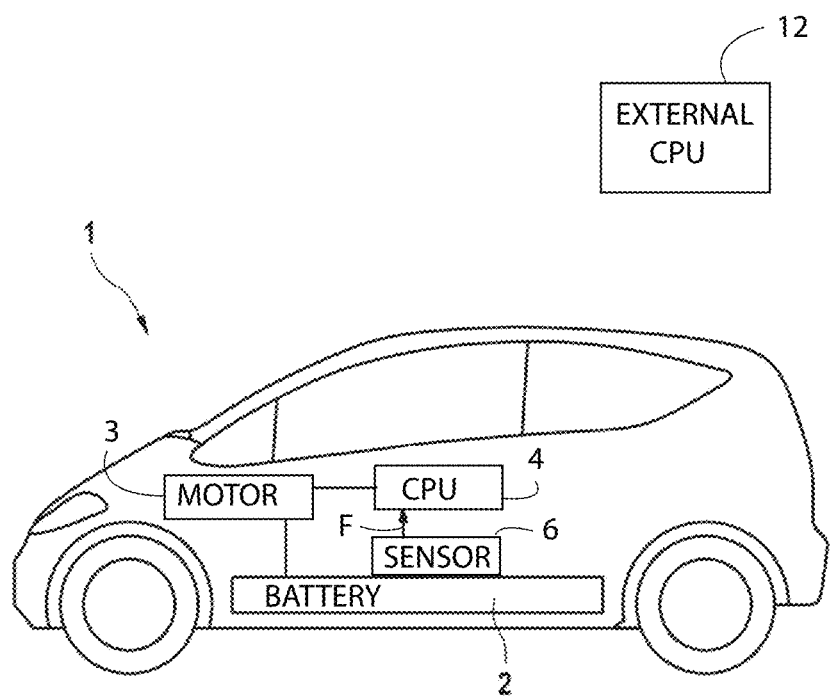
FIG. 1 shows a schematic depiction of a system for providing operating variables of vehicle batteries of vehicles in a vehicle fleet.

FIG. 1 shows a motor vehicle 1 with a vehicle battery 2 as rechargeable electrical energy store, an electric drive motor 3 and a control unit 4.

A sensor system 6 is used by the vehicle battery 2 to capture operating variables F captured in the control unit 4. In the case of a vehicle battery 2, the operating variables F can indicate a present battery current, a present battery voltage, a present battery temperature and a present state of charge (SOC), at pack, module and/or cell level alike. The operating variables F are captured in a fast time frame of between 2 Hz and 100 Hz.

Reference variables comprising time-dependent accumulated variables can be generated in the control unit 4 from the characteristics of the operating variables F. In the control unit 4, the characteristics of the operating variables are supposed to be taken as a basis for ascertaining a state of health, by using an empirical state of health model, and indicating a state of health trajectory.

State of health (SOH) is the key variable for indicating a remaining battery capacity or remaining battery charge. The state of health describes an extent of the aging of the vehicle battery or a battery module or a battery cell and can be indicated as a capacity retention rate (SOH-C) or as a rise in the internal resistance (SOH-R). The capacity retention rate SOH-C is indicated as a ratio of the measured present capacity to an initial capacity of the fully charged battery. The relative change in the internal resistance SOH-R rises as the battery ages.

The state of health trajectory indicates an association of a state of health with reference to the time-dependent reference variable, such as e.g. the life of the vehicle battery 2 that has elapsed since startup (Beginning of Life). Additionally, it is conceivable to describe the state of health on the basis of further, in particular time-dependent (accumulated), reference variables, such as e.g. Ah throughput, kilometers traveled, etc. In other words, it is possible to take the reference variables obtained from the operating variable characteristics of the motor vehicle 1 as a basis for ascertaining a state of health of the vehicle battery 2.

Figure 2:
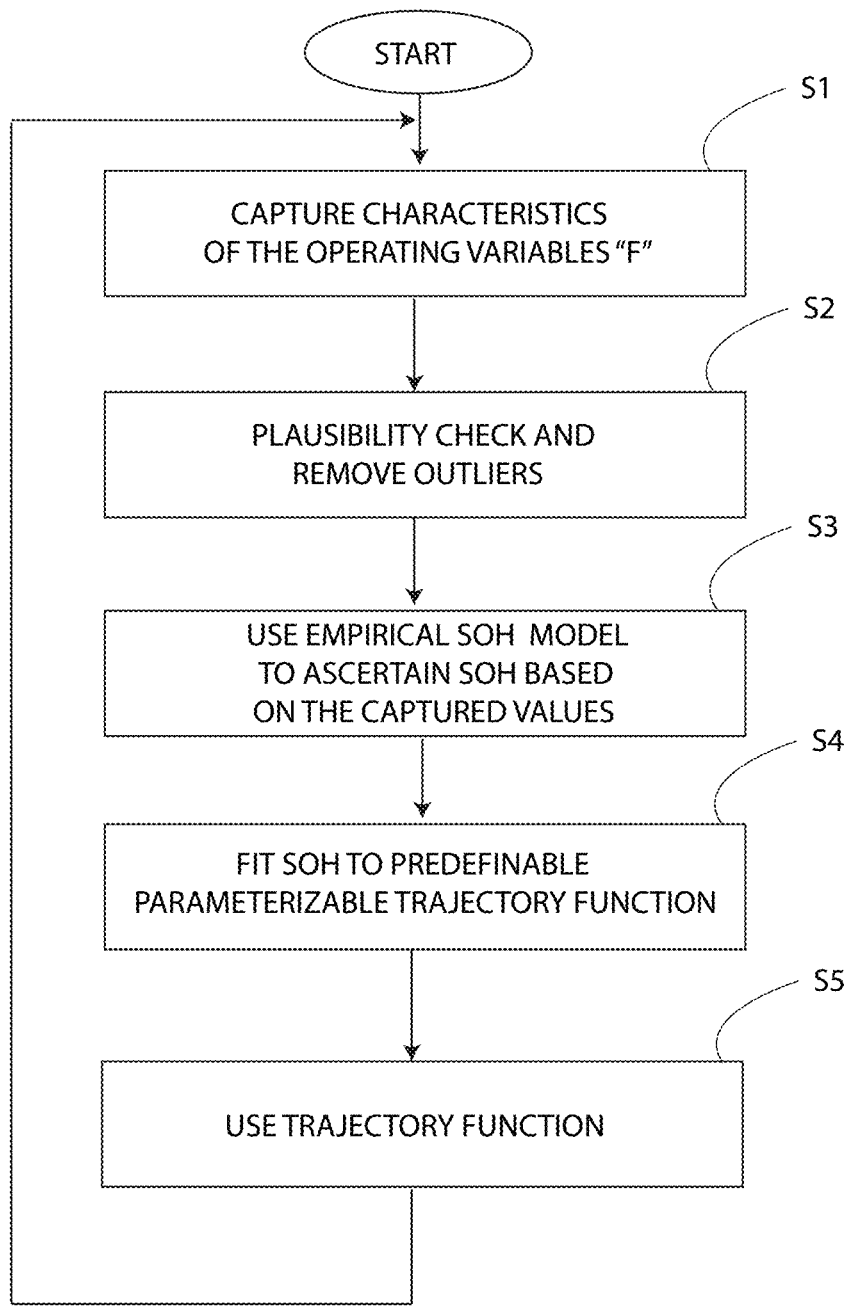
FIG. 2 shows a flowchart to illustrate a method for ascertaining a state of health trajectory of a vehicle battery in a motor vehicle.

FIG. 2 shows a flowchart to illustrate a method for operating an electrically driveable motor vehicle 1 having a vehicle battery by providing a state of health of a battery of unknown battery type. The method is performed in the control unit 4 or in the device- or vehicle-external central processing unit 12 and is preferably implemented in software there.

In step S1, the characteristics of the operating variables F used to ascertain a present state of health of the vehicle battery 2 in accordance with the state of health model are captured in the control unit 4. The captured characteristics can be transmitted to a central processing unit.

The captured characteristics of operating variables F are preprocessed in step S2 by carrying out a plausibility check and removing outliers. This can be performed in a manner known per se by means of filter methods. This step can be carried out either in the individual vehicle or in the central processing unit, the cloud.

In step S3, the characteristics of the operating variables, such as battery current and state of charge, ascertaining a state of health by using the empirical state of health model. Step S3 is preferably performed in the central processing unit, the cloud. In principle, however, it is also conceivable for it to be performed directly in the vehicle 1. The state of health can be ascertained under specific predefined operating conditions, such as e.g. during a charging process. The state of health model can be based on a simple predefined state of health model that assigns a state of health by calculating an amount of charge using the operating variables. In this case, the current integral is used to calculate the amount of charge supplied. The calculated amount of charge is then mapped to an estimated maximum battery capacity by means of a projection method by using a change in the state of charge. The nominal battery capacity can then be used to ascertain the capacity-based state of health (SOHC) of the vehicle battery 41 from this maximum battery capacity.

The internal-resistance-based state of health is calculated analogously by means of dU/dI analyses for certain trigger conditions, such as a load edge at the beginning of a charging process. The nominal values (e.g. battery capacity) are therefor can be taken from the vehicle or battery specification. Alternatively, it is also possible to learn the nominal values in a data-based manner.

The model values (state of health points) for the state of health that are provided by the empirical state of health model are fundamentally inaccurate and noisy, however, since the state of charge difference is dependent on the charging behavior of the driver and also contains a large amount of noise. The state of health points are indicated on the basis of the reference variable, which can correspond to the elapsed life, i.e. the period of time since startup (Beginning of Life), a total Ah throughput or the distance traveled.

Since all of the evaluations for ascertaining the state of health for a vehicle battery 2 using the empirical state of health model since startup (Beginning of Life) are available, all the noisy state of health points (states of health at specific times) are then fitted to a predefined parameterizable trajectory function in step S4 in order to smooth the time characteristic of the state of health points. Additionally, a complete state of health trajectory is thus obtained a posteriori. This is suitable for determining the state of health at any time since startup. This makes it possible to eliminate the noise in the indication of the states of health along the time characteristic.

Figure 3:
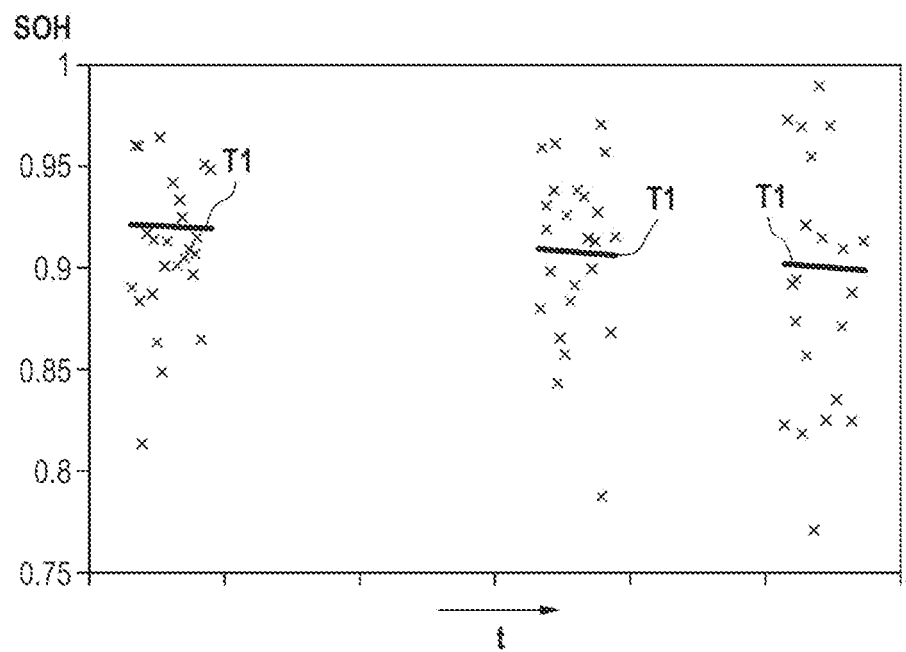
FIG. 3 shows a graph to present the ascertainment of a trajectory function from a multiplicity of state of health points.

This is shown in the depiction in FIG. 3, for example. FIG. 3 shows a characteristic of the state of health over time, the crosses indicating states of health at specific times as determined by the state of health model. The trajectory sections T1 are based on a fitted trajectory function and indicate the smoothed state of health trajectory ascertained for the vehicle 1, on the basis of the state of health points that have been determined for the specific vehicle. Step S4 is preferably performed in the central processing unit 2, the cloud. In principle, however, it is also conceivable for it to be performed directly in the vehicle if there is provision for a sufficiently large memory for historic information.

In the simplest case, this trajectory function is a linear model and can then be extrapolated into the future in order to estimate future states of health. In general, a non-linear data-based model is used. As such, there are for example LiFeP battery cells, LiTiO, LiCoO, LiNiO, LiMnO, LiNiCoAlO and LiNiCoMnO battery cells, and others, for which this general approach can be used to determine state of health.

Besides non-linear data-based models, machine-learning methods, in particular regression models, are especially very suitable for fitting the SOH values calculated in step S3. Supervised-learning methods, such as Gaussian processes or neural networks, especially using LSTM (long short-term memory) techniques, can be used for this purpose.

In step S5, the trajectory function can be used for extrapolation and hence to predict the state of health. By way of example, this allows a remaining life or a remaining period of use to be ascertained by determining when a predefined limit state of health is reached. The calculated results, such as present SOH and remaining life, can be transmitted from the cloud to the vehicle. Additionally, the updated parameterization of the trajectory function can also be transmitted to the vehicle.

What is claimed is:

1. A method for ascertaining a state of health trajectory of an electrical energy store of a device, comprising:
   continually providing characteristics of operating variables that characterize operation of the electrical energy store;
   ascertaining a plurality of state of health points based on the operating variables using an empirical state of health model at multiple times, each state of health point indicating an ascertained state of health of the electrical energy store based on a time-dependent reference variable;
   parameterizing a trajectory function for describing a state of health trajectory of the electrical energy store based on the plurality of state of health points, in order to smooth a time characteristic of the plurality of state of health points;
   determining a state of health for the electrical energy store using the parameterized trajectory function; and
   operating the device based on the determined state of health for the electrical energy store.

2. The method according to claim 1, further comprising:
   signaling the state of health for the electrical energy store as determined from the parameterized trajectory function.

3. The method according to claim 1, further comprising:
   determining a predicted state of health for the electrical energy store using the parameterized trajectory function.

4. The method according to claim 1, further comprising:
   determining a remaining life of the electrical energy store using the parameterized trajectory function.

5. The method according to claim 1, wherein the time-dependent reference variable is provided as an elapsed life since startup, an amp-hour throughput, or accumulated performance information for the device including a total distance covered by the device.

6. The method according to claim 1, wherein the empirical state of health model determines the states of health points based on a change in charge in a charging process and/or a discharge process and/or from an internal resistance determination using a change in voltage for a specific battery current characteristic.

7. The method according to claim 1, wherein the trajectory function comprises a linear function, a polynomial function, a data-based model, a regression model, a Gaussian process, a neural network, and/or a recurrent neural network.

8. The method according to claim 1, wherein:
   the electrical energy store is used for operating the device, and
   the device is a motor vehicle, a pedelec, an aircraft, a drone, a machine tool, a consumer electronics device including a mobile phone, an autonomous robot, and/or a domestic appliance.

9. The method according to claim 1, wherein:
the determining the state of health and the parameterizing of the trajectory function are performed in an external central processing unit that is external to the device, and
function parameters of the trajectory function are transmitted to the device.

10. A non-transitory machine-readable storage medium on which computer executable program product instructions are executed by at least one data processing device, to cause the at least one data processing device to perform the method of claim 1.

11. An apparatus for ascertaining a state of health trajectory of an electrical energy store of a device comprising:
at least one data processing device configured to:
continually provide characteristics of operating variables that characterize operation of the electrical energy store;
ascertain a plurality of state of health points based on the operating variables using an empirical state of health model at multiple times, each state of health point indicating an ascertained state of health of the electrical energy store based on a time-dependent reference variable;
parameterize a trajectory function for describing a state of health trajectory of the electrical energy store based on the plurality of state of health points, in order to smooth a time characteristic of the plurality of state of health points;
determining a state of health for the electrical energy store using the parameterized trajectory function,
wherein the device is operated based on the determined state of health of the electrical energy store.

* * * * *